(12) United States Patent
Booth et al.

(10) Patent No.: US 8,207,768 B2
(45) Date of Patent: Jun. 26, 2012

(54) DIGITAL LOCKED LOOPS AND METHODS WITH CONFIGURABLE OPERATING PARAMETERS

(75) Inventors: Eric Booth, Boise, ID (US); George G. Carey, Boise, ID (US); Brian Callaway, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 13/074,785

(22) Filed: Mar. 29, 2011

(65) Prior Publication Data

US 2011/0175655 A1    Jul. 21, 2011

Related U.S. Application Data

(62) Division of application No. 12/361,320, filed on Jan. 28, 2009, now Pat. No. 7,928,782.

(51) Int. Cl.
*H03L 7/06* (2006.01)
(52) U.S. Cl. .......................................... 327/156; 327/147
(58) Field of Classification Search .................. 327/147, 327/156
See application file for complete search history.

(56) References Cited

U.S. PATENT DOCUMENTS

| | | | |
|---|---|---|---|
| 5,550,515 A * | 8/1996 | Liang et al. ................... 331/11 |
| 6,377,091 B1 * | 4/2002 | Williams et al. .............. 327/156 |
| 7,042,258 B2 * | 5/2006 | Booth et al. .................. 327/115 |
| 7,109,807 B2 * | 9/2006 | Lin ................................ 331/25 |
| 7,129,794 B2 * | 10/2006 | Lin ................................ 331/25 |
| 7,132,898 B2 * | 11/2006 | Lin ................................ 331/25 |
| 7,259,604 B2 * | 8/2007 | Gomm ......................... 327/175 |
| 7,276,943 B2 * | 10/2007 | Starr et al. .................... 327/147 |
| 7,375,593 B2 * | 5/2008 | Self ................................ 331/16 |
| 7,463,099 B2 * | 12/2008 | Lin ................................ 331/25 |
| 7,511,579 B2 * | 3/2009 | Wang et al. .................... 331/16 |
| 7,567,140 B2 * | 7/2009 | Kim ............................. 331/183 |
| 7,629,822 B2 * | 12/2009 | Kim et al. .................... 327/158 |
| 7,639,090 B2 * | 12/2009 | Lin ................................ 331/25 |
| 7,688,123 B2 * | 3/2010 | Oh ............................... 327/158 |
| 7,928,782 B2 * | 4/2011 | Booth et al. .................. 327/158 |
| 8,022,778 B2 * | 9/2011 | Nagaraj et al. .......... 331/117 FE |
| 2006/0078079 A1 * | 4/2006 | Lu ............................... 375/376 |
| 2006/0259807 A1 * | 11/2006 | Sachs et al. .................. 713/500 |
| 2007/0066268 A1 * | 3/2007 | Simic et al. .................. 455/318 |
| 2008/0112526 A1 * | 5/2008 | Yi ................................ 375/376 |
| 2008/0284529 A1 * | 11/2008 | Refeld et al. .................. 331/57 |
| 2008/0297215 A1 * | 12/2008 | Ma ............................... 327/158 |
| 2009/0228227 A1 * | 9/2009 | Suda ............................. 702/79 |
| 2009/0267663 A1 * | 10/2009 | Varricchione ................ 327/158 |
| 2010/0188125 A1 * | 7/2010 | Booth et al. .................. 327/158 |
| 2011/0175655 A1 * | 7/2011 | Booth et al. .................. 327/158 |

\* cited by examiner

*Primary Examiner* — Lincoln Donovan
*Assistant Examiner* — Adam Houston
(74) *Attorney, Agent, or Firm* — Dorsey & Whitney LLP

(57) ABSTRACT

A locked loop may have an adjustable hysteresis and/or a tracking speed that can be programmed by a user of an electronic device containing the locked loop or controlled by an integrated circuit device containing the locked loop during operation of the device. The looked loop may include a phase detector having a variable hysteresis, which may be coupled to receive a reference clock signal and an output clock signal from a phase adjustment circuit through respective frequency dividers that can vary the rate at which the phase detector compares the phase of the output clock signal to the phase of the reference clock signal, thus varying the tracking speed of the loop. The hysteresis and tracking speed of the locked loop may be programmed using a variety of means, such as by a temperature sensor for the electronic device, a mode register, a memory device command decoder, etc.

18 Claims, 3 Drawing Sheets

DIGITAL LOCKED LOOPS AND METHODS WITH CONFIGURABLE OPERATING PARAMETERS

CROSS-REFERENCE TO RELATED APPLICATION

This application is a divisional of U.S. patent application Ser. No. 12/361,320, filed Jan. 28, 2009, U.S. Pat. No. 7,928, 782. This application is incorporated by reference herein in its entirety and for all purposes.

TECHNICAL FIELD

This invention relates to locked loops, such as delay lock loops ("DLLs") and phase lock loops ("PLLs"), and, more particularly, to locked loops having operating parameters that may be configured.

BACKGROUND OF THE INVENTION

A variety of components are included in integrated circuits that affect the rate at which power is consumed. For example, delay lock loops are often found in memory devices to perform such functions as synchronizing one signal, such as a data strobe signal DQS, to another signal, such as an external clock signal. The DQS signal can then be used to latch data at a time that is synchronized with the external clock signal.

A typical prior art DLL 10 is shown in FIG. 1. The DLL 10 includes a delay line 14, which typically uses a large number of gates and/or inverters that are coupled to each other in series. At least some of the gates and/or inverters in the delay line 14 switch at each transition of a reference clock signal $CLK_{REF}$ that is applied to the input of the delay line 14. Each time the gates and/or inverters switch, they consume power. The DLL 10 also includes a phase detector 16 and control circuitry 18 coupled to the output of the phase detector 16 for adjusting the delay of the delay line 14. The phase detector 16 compares the phase of the reference clock signal $CLK_{REF}$ to the phase of an output clock signal $CLK_{OUT}$ generated by delay line 14 to determine a phase error. The $CLK_{OUT}$ signal is thus used as a feedback clock signal, although other signals derived from the $CLK_{OUT}$ signal may instead be used as the feedback clock signal. If the phase detector 16 is a digital phase detector, it typically generates an UP signal if the phase of the $CLK_{OUT}$ signal leads the phase of the $CLK_{REF}$ signal by more than a first value. The control circuitry 18 responds to the UP signal by increasing the delay of the delay line 14 to reduce the phase error. Similarly, the phase detector 16 generates a DN signal if the phase of the $CLK_{OUT}$ signal lags the phase of the $CLK_{REF}$ signal by more than a second value. In that case, the control circuitry 18 responds to the DN signal by decreasing the delay of the delay line 14 to reduce the phase error. The phase detector 16 generates neither an UP signal or a DN signal if the magnitude of the phase error is between the first value and the second value. The first and second values thus establish a hysteresis for the DLL 10.

The amount of hysteresis provided by the phase detector 16 has several effects on the operating performance of the DLL 10. Reducing the hysteresis results in a "tighter" loop that causes the phase of the $CLK_{OUT}$ signal to more closely follow the phase of the $CLK_{REF}$ signal. On the other hand, increasing the hysteresis allows the phase of the $CLK_{OUT}$ signal to drift farther from the phase of the $CLK_{REF}$ signal. However, the power consumed by the DLL 10 is also affected by the hysteresis since power is consumed each time the phase detector 16 generates an UP or DN signal and the control circuitry 18 and delay line 14 respond accordingly. Thus, a smaller hysteresis generally results in more frequent delay line adjustments because the permissible phase error tolerance is correspondingly smaller. Thus, the power consumed by the DLL 10 can be reduced by increasing the size of the hysteresis provided by the phase detector 16. Also, a smaller hysteresis makes the DLL 10 more susceptible to noise since noise imparted to the $CLK_{REF}$ signal and/or the $CLK_{OUT}$ signal can momentarily increase the difference in phase between the $CLK_{REF}$ and the $CLK_{OUT}$ signals beyond the phase error tolerance.

Another operating parameter of the DLL 10 that can effect power consumption is the tracking speed of the DLL 10, i.e., how frequently the phase detector 16 compares the phase of the reference clock signal $CLK_{REF}$ to the phase of an output clock signal $CLK_{OUT}$. A high tracking speed in which the phase detector 16 compares the phase of the reference clock signal $CLK_{REF}$ to the phase of an output clock signal $CLK_{OUT}$ every cycle of the reference clock signal $CLK_{REF}$ causes a relatively high power consumption since power is consumed each time the phase comparison is made and the control circuitry 18 and delay line 14 respond to a phase error. However, a longer interval between phase comparisons resulting in a relatively slow tracking speed may allow a phase error to drift well outside the error tolerance set by the hysteresis.

The size of the hysteresis provided by a phase detector as well as the tracking speed and other operating parameters of DLLs are determined by the design of the DLLs. Designers of DLLs normally select circuit components to provide a specific set of performance parameters. However, these performance parameters may not be optimum for a specific application in which a DLL is used. For example, as mentioned above, a DLL may be used in an integrated circuit memory device. One purchaser of the memory device may install it in a laptop computer or other portable device. For this application, a large hysteresis and/or a slow tracking speed providing low power consumption may be more important than the accuracy at which the phase of a clock signal generated by the DLL corresponds to the phase of a reference clock signal. Another purchaser of the memory device may install it in a high-speed desktop computer where the memory device operates at a very high clock speed. For this application, the ability of the memory device to correctly latch data may depend on a DQS signal generated by the DLL closely tracking the phase of a reference clock signal. As a result, a small hysteresis and a high tracking speed may be desired. Unfortunately, the operating parameters of conventional DLLs used in memory devices and other integrated circuits cannot be easily adjusted by users or other circuits, thus potentially resulting in performance limitations in electronic devices containing such integrated circuits.

Although the problem of operating parameter adjustment inflexibility has been discussed in the context of DLLs, the problem also exists in other types of locked loops, such as phase lock loops.

There is therefore a need for a locked loop and method in which the operating parameters can be easily adjusted for optimal performance in different applications.

DETAILED DESCRIPTION

Figure 1:
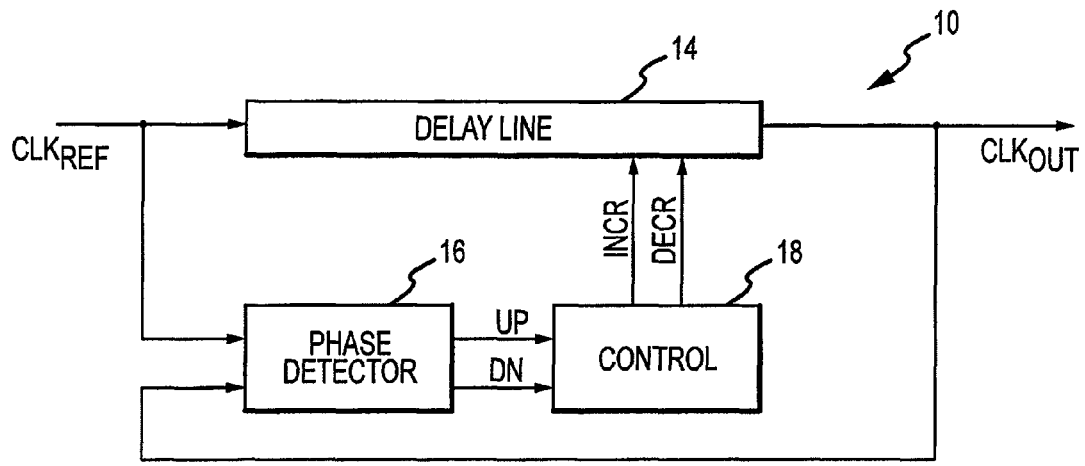
FIG. 1 is a block diagram of a conventional delay lock loop.
Figure 2:
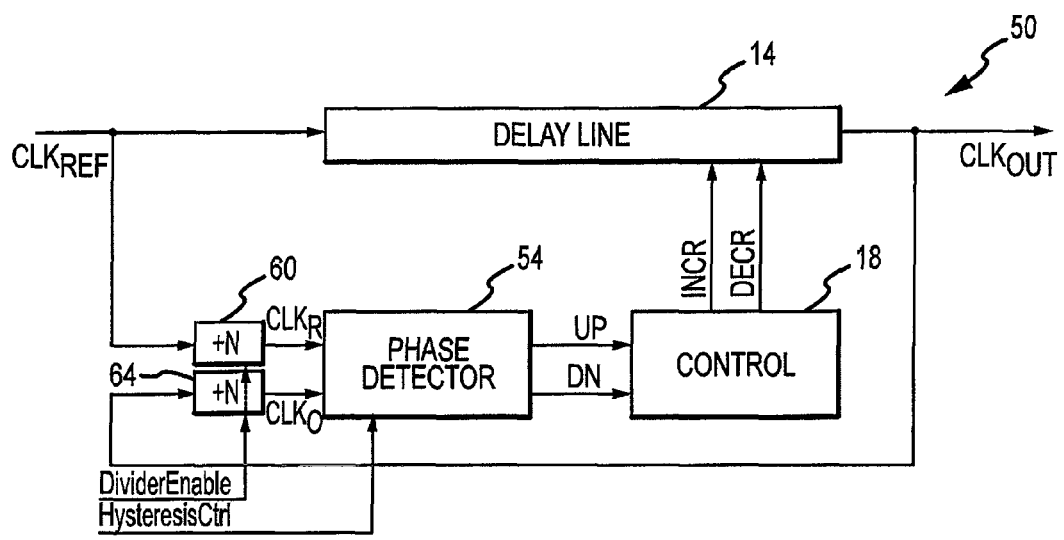
FIG. 2 is a block diagram of a delay lock loop according to an embodiment of the invention.

An embodiment of a DLL 50 according to an embodiment of the invention is shown in FIG. 2. The DLL 50 may use the same delay line 14 and control circuit 18 that is used in the DLL 10 of FIG. 1. However, a phase detector 54 used in the DLL 50 differs from the phase detector 16 used in the DLL 10 of FIG. 1. The phase detector 54 includes an input for receiving a hysteresis control signal that adjusts the hysteresis provided by the phase detector 54. As explained in greater detail below, the hysteresis of the phase detector 54 may be adjusted by a user or other circuit when the DLL 50 or a device containing the DLL 50 is placed in operation. Thus, the user or other circuit may select a large hysteresis to conserve power or the user or other circuit may select a small hysteresis for good noise immunity and/or where it is important for the output of the DLL 50 to closely follow the phase of a reference clock signal.

With further reference to FIG. 2, the DLL 50 also includes a frequency divider 60 positioned between the input of the delay line 14 and one of the inputs of the phase detector 54. Similarly, a second frequency divider 64 is positioned between the output of the delay line 14 and the other input of the phase detector 54. When enabled by a DividerEnable signal, the frequency dividers 60, 64 divide the frequency of the reference clock signal $CLK_{REF}$ and the output clock signal $CLK_{OUT}$, respectively, by a divisor N to generate respective $CLK_R$ and $CLK_O$ signals. As a result, the rate at which the phase detector 54 compares the phase of the reference clock signal $CLK_{REF}$ to the phase of the output clock signal $CLK_{OUT}$ is also reduced by N, thereby reducing the tracking speed of the DLL 50. However, as explained above, power is consumed each time the phase detector 54 generates an UP or DN signal and the control circuitry 18 and delay line 14 respond accordingly. Therefore, the power consumed by the DLL 50 can be reduced by enabling the frequency dividers 60, 64 to divide the respective clock signals by N. One the other hand, if it is important for the output clock signal $CLK_{OUT}$ to closely follow the phase of a reference clock signal $CLK_{REF}$, particularly if the phase of the reference clock signal or the output clock signal varies at a high rate, the frequency dividers 60, 64 can be disabled so that they simply couple the reference clock signal $CLK_{REF}$ and the output clock signal $CLK_{OUT}$ to the respective inputs of the phase detector 54.

In the embodiment shown in FIG. 2, the frequency dividers 60, 64 operate in a binary manner by either dividing the reference clock signal $CLK_{REF}$ and the output clock signal $CLK_{OUT}$ by N or not. However, in another embodiment, the value of N can be selected among a plurality of choices depending upon the desired tradeoff between high phase accuracy and good noise immunity on one hand and low power consumption on the other.

Figure 3:
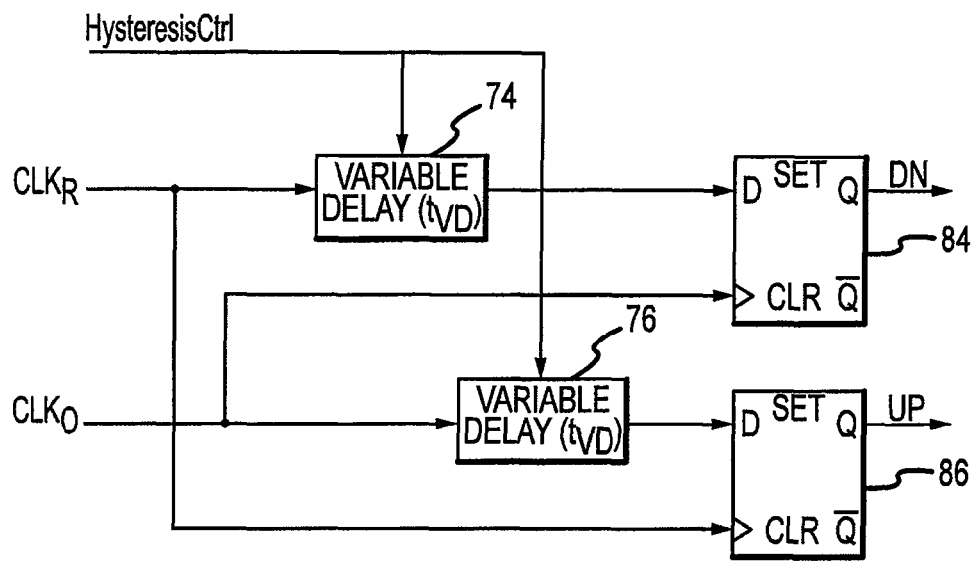
FIG. 3 is a block diagram of an embodiment of a phase detector that may be used in the delay lock loop of FIG. 2.
Figure 4A:
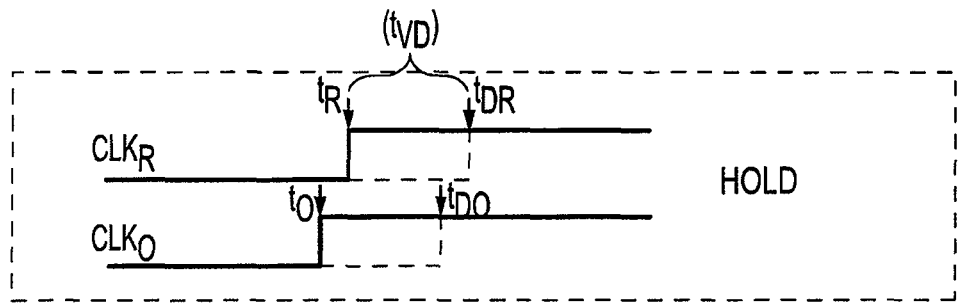
FIGS. 4A-C are timing diagrams showing various phase relationships between a reference clock signal and an output clock signal.
Figure 4B:
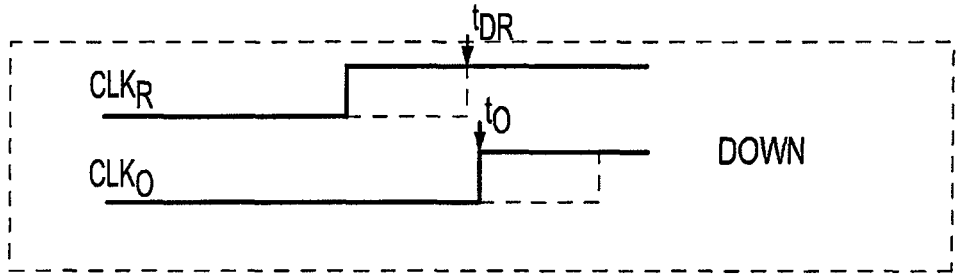

An embodiment of the phase detector 54 used in the DLL of FIG. 2 is shown in FIG. 3. The phase detector includes a pair of delay lines 74, 76 that delay the clock signal $CLK_R$ from the divider 60 and the clock signal $CLK_O$ from the divider 64, respectively, by a delay value $T_{VD}$. The output of the delay line 74 is applied to the data input D of, a first flip-flop 84, and the output of the delay line 76 is applied to the data input D of, a second flip-flop 86. The first flip-flop 84 is clocked by the clock signal $CLK_O$, and the second flip-flop 86 is clocked by the clock signal $CLK_R$. As a result, the first flip-flop 84 outputs the level of delayed clock signal $CLK_R$ at the rising edge of the clock signal $CLK_O$. Therefore, with reference to FIG. 4A, the first flip-flop 84 compares the time $t_O$ to the time $t_{DR}$. As long as $t_O$ is not later than $t_{DR}$, the output of the delay line 74 will be low when the flip-flop 84 is clocked so that the flip-flop 84 will output an inactive low DN signal. On the other hand, if $t_O$ is later than $t_{DR}$ as shown in FIG. 4B, the output of the delay line 74 will be high when the flip-flop 84 is clocked. The flip-flop 84 will therefore output an active high DN signal to cause the control circuit 18 (FIG. 2) to apply a signal to the delay line 14 to reduce the delay of the delay line 14. As a result, the delay of the $CLK_O$ signal relative to the $CLK_R$ signal will be reduced toward the phase relationship shown in FIG. 4A.

Figure 4C:
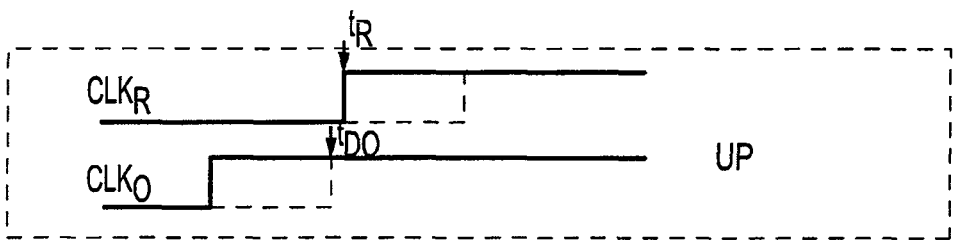

As mentioned above, the second flip-flop 86 is clocked by the clock signal $CLK_R$ so that the second flip-flop 86 outputs the level of delayed clock signal $CLK_O$ at the rising edge of the clock signal $CLK_R$. Returning to FIG. 4A, the second flip-flop 86 therefore compares the time $t_{DO}$ to the time $t_R$. As long as $t_{DO}$ is not earlier than $t_R$, the output of the delay line 76 will be low when the flip-flop 86 is clocked so that the flip-flop 86 will output an inactive low UP signal. If $t_{DO}$ is earlier than $t_R$ as shown in FIG. 4C, the output of the delay line 76 will be high when the flip-flop 86 is clocked. The flip-flop 86 will therefore output an active high UP signal to increase the delay of the delay line 14. As a result, the delay of the $CLK_O$ signal relative to the $CLK_R$ signal will be increased toward the phase relationship shown in FIG. 4A. Insofar as each of the delay lines 74, 76 delay the respective clock signals $CLK_R$ and $CLK_O$ by a delay of $t_{VD}$, the size of the hysteresis is $2t_{VD}$. However, in other embodiments the delay of the delay line 74 is different from the delay of the delay line 76.

Figure 5:
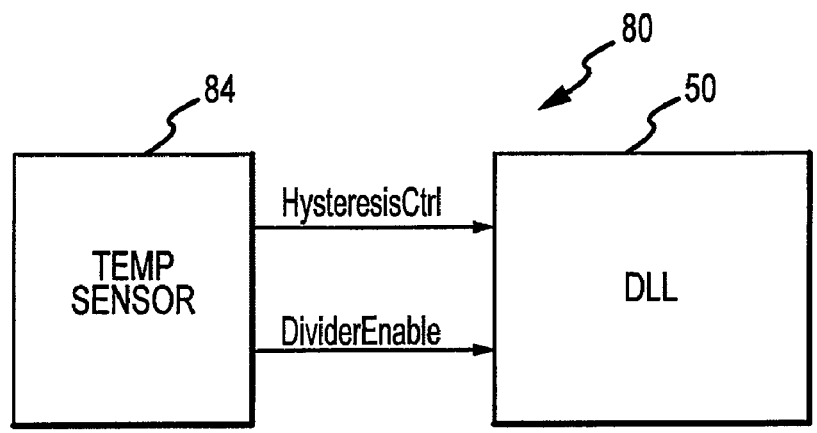
FIG. 5 is a block diagram of a delay lock loop system according to an embodiment of the invention.

FIG. 5 is a block diagram of a delay lock loop system 80 according to an embodiment of the invention. The system 80 uses the DLL 50 of FIG. 2 or a DLL according to some other embodiment of the invention. The DLL 50 is coupled to a temperature sensor 84 that generates the hysteresis control signal and the DividerEnable signal as a function of the temperature, and hence the power consumed by, an electronic device (not shown) containing the system 80. However, in other embodiments the power consumed by an electronic device (not shown) containing the DLL 50 is sensed by other means.

Figure 6:
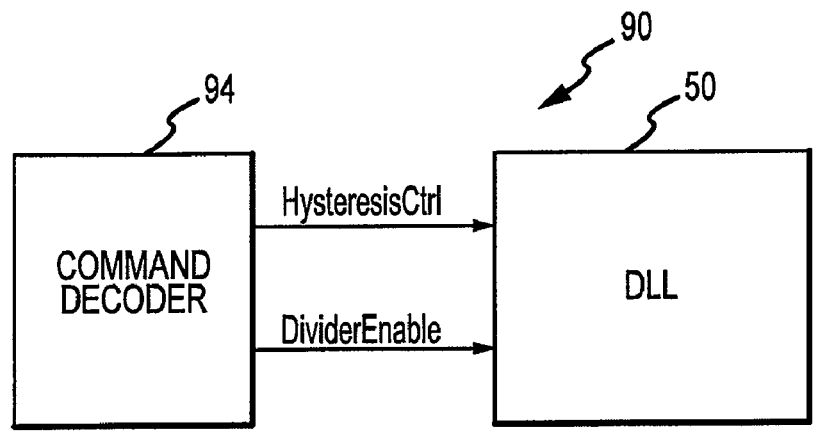
FIG. 6 is a block diagram of a delay lock loop system according to another embodiment of the invention.

A delay lock loop system 90 according to another embodiment of the invention is shown in FIG. 6. The system 90 again uses the DLL 50 of FIG. 2 or a DLL according to some other embodiment of the invention. The DLL 50 is coupled to a command decoder 94 used in a memory device, such as a dynamic random access memory device or a flash memory device. The command decoder 94 generates the hysteresis control signal and the DividerEnable signal as a function of the operation being performed by the memory device containing the command decoder 94. For example, when data are not being read from or written to the memory device, the command decoder 94 may generate a DividerEnable signal and a hysteresis control signal that causes the DLL 50 to remain locked, but allows the phase of the output clock signal $CLK_{OUT}$ to deviate substantially from the phase of the reference clock signal. On the other hand, when data are being written to the memory device at a high rate of speed, the command decoder 94 may generate a DividerEnable signal that disables the frequency dividers 60, 64 and a hysteresis control signal that provides only a small amount of hysteresis. The phases error tolerance during a read operation may be greater than that of a write, so that the command decoder 94 may generate a hysteresis control signal that provides a larger amount of hysteresis, although it may still generate a Divider-Enable signal that enables the frequency dividers 60, 64.

Figure 7:
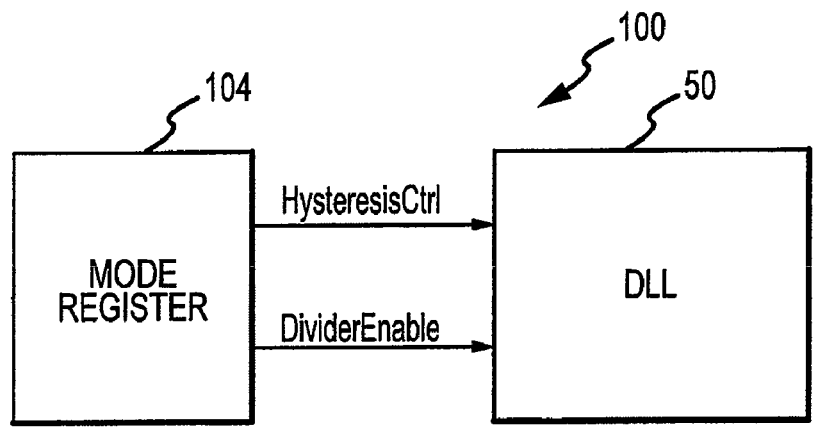
FIG. 7 is a block diagram of a delay lock loop system according to still another embodiment of the invention.

A delay lock loop system 100 according to still another embodiment of the invention is shown in FIG. 7. The system 100 also uses the DLL 50 of FIG. 2 or a DLL according to some other embodiment of the invention, and the DLL 50 is coupled to a mode register 104 of the type frequently used in memory devices. The mode register 104 may be programmed to generate a hysteresis control signal and a DividerEnable signal appropriate to a particular application in which the memory device is used.

Although the present invention has been described with reference to the disclosed embodiments, persons skilled in the art will recognize that changes may be made in form and detail without departing from the invention. For example, although the embodiments are primarily disclosed in the context of delay lock loops, it will be understood that other embodiments may include other types of locked loops, such as phase lock loops. Also, although the disclosed embodiments of the invention use both a phase detector having a variable hysteresis and frequency dividers dividing the reference clock signal $CLK_{REF}$ and the output clock signal $CLK_{OUT}$ by a divisor, it should be understood that either of these features may be used alone. Thus, a locked loop may include a phase detector having a fixed hysteresis and frequency dividers dividing the reference clock signal $CLK_{REF}$ and the output clock signal $CLK_{OUT}$ by a divisor. A locked loop may also include a phase detector having a variable hysteresis but no frequency dividers. Such modifications are well within the skill of those ordinarily skilled in the art. Accordingly, the invention is not limited except as by the appended claims.

We claim:

1. A method of using an integrated circuit device having a delay lock loop structured to have an operating parameter, the method comprising:
   determining an operation occurring in the integrated circuit device;
   in response to a first operation, adjusting an operating parameter of the lock loop during operation of the integrated circuit device to a first condition; and
   in response to a second operation, adjusting the operating parameter of the lock loop during operation of the integrated circuit device to a second condition different than the first condition.

2. The method of claim 1 wherein the lock loop comprises a delay lock loop, and wherein the operating parameter comprises a tracking speed of the delay lock loop, the magnitude of the tracking speed being determined by selecting the tracking speed after fabrication of the integrated circuit device.

3. The method of claim 1 wherein the lock loop comprises a delay lock loop, and wherein the operating parameter comprises a hysteresis of the delay lock loop, the magnitude of the hysteresis being determined by selecting a hysteresis value after fabrication of the integrated circuit device.

4. The method of claim 1 wherein the act of adjusting an operating parameter of the lock loop during operation of the integrated circuit device comprises programming a register to select a value of the operating parameter.

5. The method of claim 1 wherein the operation occurring in the integrated circuit device comprises a read or write operation.

6. The method of claim 1 wherein the act of adjusting an operating parameter of the lock loop during operation of the integrated circuit device comprises adjusting the operating parameter of the lock loop based at least in part on a temperature of the integrated circuit device.

7. The method of claim 1 wherein the act of adjusting an operating parameter of the lock loop during operation of the integrated circuit device comprises adjusting the operating parameter of the lock loop based at least in part on power consumed by the integrated circuit device.

8. The method of claim 1 wherein the act of adjusting an operating parameter of the lock loop during operation of the integrated circuit device comprises adjusting an operating parameter of a phase detector of the lock loop.

9. The method of claim 1 wherein the act of adjusting an operating parameter of the lock loop during operation of the integrated circuit device comprises at least one of:
   adjusting a frequency of a clock signal provided to the lock loop; and
   adjusting a delay of at least one of a reference clock signal or an output clock signal provided to the lock loop for comparison during operation of the lock loop.

10. A method of using an integrated circuit device having a lock loop, the method comprising:
    adjusting a delay added to at least one of a reference clock signal and an output signal differently depending on an operation being performed by the integrated circuit to adjust an operating parameter of the integrated circuit, both the reference clock signal and the output signal provided to a phase detector of the lock loop;
    detecting a phase difference between the delayed signals of the reference clock signal and the output clock signal; and
    adjusting an adjustable delay of the lock loop based at least in part on the detected phase difference to lock the lock loop.

11. The method of claim 10 wherein selectively adjusting the delay added to at least one of a reference clock signal and an output signal to adjust an operating parameter of the integrated circuit comprises adjusting the delay to adjust a hysteresis of the phase detector.

12. The method of claim 10, further comprising selectively changing a clock frequency of at least one of the reference clock signal and the output clock signal provided to the phase detector to adjust the operating parameter of the integrated circuit.

13. The method of claim 12 wherein the clock frequency of the reference clock signal and the output clock signal are changed differently.

14. A method of using an integrated circuit device having a lock loop, the method comprising:
    selectively adjusting a hysteresis of a phase detector of the lock loop during operation of the integrated circuit device by locking the lock loop to allow a phase of the output clock signal to deviate from a phase of the reference clock signal for operations other than read or write operations, and decreasing the hysteresis of the phase detector responsive to a read or write operation.

15. The method of claim 14 wherein selectively adjusting a hysteresis of a phase detector of the lock loop during operation of the integrated circuit device comprises increasing a clock frequency of at least one of a reference clock signal and an output clock signal provided to the phase detector to reduce power during operation of the integrated circuit device.

16. The method of claim 14 wherein selectively adjusting a hysteresis of a phase detector of the lock loop during operation of the integrated circuit device comprises adjusting a delay of a reference clock signal or an output clock signal both provided to the phase detector during operation of the lock loop.

17. The method of claim 14 wherein the hysteresis of the phase detector is decreased to a greater extent for a write operation than for a read operation.

18. The method of claim 17 wherein adjusting the hysteresis of the phase detector for the read operation comprises dividing clock frequencies of the reference and output clock signals.

* * * * *

UNITED STATES PATENT AND TRADEMARK OFFICE
CERTIFICATE OF CORRECTION

PATENT NO. : 8,207,768 B2  
APPLICATION NO. : 13/074785  
DATED : June 26, 2012  
INVENTOR(S) : Eric Booth et al.

Page 1 of 1

It is certified that error appears in the above-identified patent and that said Letters Patent is hereby corrected as shown below:

On the face page, in field (57), under "Abstract", in column 2, line 5, delete "looked" and insert -- locked --, therefor.

Signed and Sealed this  
Twenty-eighth Day of August, 2012

David J. Kappos  
*Director of the United States Patent and Trademark Office*